United States Patent
Morche

Patent Number: 5,892,392
Date of Patent: Apr. 6, 1999

[54] DEVICE FOR SETTING A BIAS SOURCE AT STAND-BY

[75] Inventor: Colette Morche, Meylan, France

[73] Assignee: SGS-Thomson Microelectronics S.A., Saint Genis, France

[21] Appl. No.: 883,257

[22] Filed: Jun. 26, 1997

Related U.S. Application Data

[63] Continuation of Ser. No. 493,831, Jun. 22, 1995, abandoned.

[30] Foreign Application Priority Data

Jun. 27, 1994 [FR] France .................................. 94 08118

[51] Int. Cl.⁶ ........................................... H03K 3/01
[52] U.S. Cl. ........................... 327/544; 327/530; 327/403
[58] Field of Search ................................ 327/403, 404, 327/538, 540, 541, 543, 544, 545, 530; 323/315

[56] References Cited

U.S. PATENT DOCUMENTS

| | | | |
|---|---|---|---|
| 4,450,367 | 5/1984 | Whatley | 327/538 |
| 4,713,560 | 12/1987 | Herndon | 307/455 |
| 4,965,469 | 10/1990 | Kondoh et al. | 327/541 |
| 5,038,053 | 8/1991 | Djenguerian et al. | 327/540 |
| 5,155,384 | 10/1992 | Ruetz | 307/296.8 |
| 5,204,612 | 4/1993 | Lingstaedt | 323/317 |
| 5,218,238 | 6/1993 | Nonaka et al. | 307/296.1 |
| 5,384,740 | 1/1995 | Etoh et al. | 327/540 |
| 5,404,096 | 4/1995 | Thiel | 323/312 |

*Primary Examiner*—Timothy P. Callahan
*Assistant Examiner*—Jung Ho Kim
*Attorney, Agent, or Firm*—Wolf, Greenfield & Sacks, P.C.

[57] ABSTRACT

The invention relates to a device for setting at stand-by a bias source through a stand-by control signal, including an inverter with an active load controlled by the bias source. The inverter includes a first p-channel MOS transistor, whose source is connected to a positive terminal of the supply voltage of the bias source, whose drain constitutes the inverter output connected to a control input of the bias source, and whose gate constitutes the input of the inverter receiving the stand-by inducing control signal.

8 Claims, 3 Drawing Sheets

DEVICE FOR SETTING A BIAS SOURCE AT STAND-BY

This application is a continuation of application Ser. No. 08/493,831, filed Jun. 22, 1995, now abandoned.

BACKGROUND OF THE INVENTION

1. Field of the Invention

The present invention relates to a device for setting a bias source at stand-by. It more specifically applies to a device using an inverter for controlling the deactivation of a bias source.

This application is related to an application U.S. Ser. No. 08,493,753 entitled DEVICE FOR SETTING A BIAS SOURCE AT PARTIAL STAND-BY AND CONTROL CIRCUIT FOR SUCH A SOURCE and to an application U.S. Ser. No. 08/493,851 entitled BIAS SOURCE CONTROL CIRCUIT, both filed on even date herewith, and incorporated herein by reference.

2. Discussion of the Related Art

Stand-by devices are used to reduce power consumption in a circuit during periods of non-use by deactivating the bias source, without it being necessary to switch off the circuit. They are of particular interest for systems with an independent power supply, consisting of, for example, ordinary or rechargeable batteries, such as remote sensors. The role of such sensors is, for example, to transmit data to a control panel in the case of a change in the state of the sensor. In such devices, it is essential to limit the consumption of the sensor during periods when its state is stable. In order to do this, the bias source of its emission units is set at stand-by when the sensor is in a stable state for a predetermined time interval. This enables the consumption of the device to be reduced during these periods. The bias source is reactivated as soon as the stand-by control signal changes state, giving an indication that the sensor no longer is in a stable state.

Conventionally, a device for setting a bias source at stand-by is constituted by an inverter including two MOS transistors connected between two bias source supply terminals.

FIG. 1 shows a conventional stand-by device. A bias source 1 is supplied by a supply voltage between two terminals A and B at potentials Vcc and Vss, respectively.

The bias source may, as an example, be constituted by a ΔVbe/R current source. Its known detailed constitution is not shown. It will only be noted that it consists in, for example, two branches of transistors connected as current mirrors between supply voltage terminals A and B. Each branch is constituted by a bipolar NPN type transistor and two MOS transistors, with a first p-channel transistor and a second n-channel transistor, a biasing resistor being interposed between the bipolar transistor and the first MOS transistor of the second branch. An example of the bias source is described in the copending application filed on even date herewith and entitled DEVICE FOR SETTING A BIAS SOURCE AT PARTIAL STAND-BY AND CONTROL CIRCUIT FOR SUCH A SOURCE.

A control input E is constituted by the drains of the MOS transistors of the first branch. This control input E receives a stand-by control signal "Stand-by" through a CMOS inverter constituted by two MOS transistors, MP1, MN2. These two transistors MP1, MN2 are connected between the two supply terminals A, B. The source of p-channel transistor MP1 is connected to the positive supply terminal A at potential Vcc, whereas its drain is connected to the drain of n-channel transistor MN2. The source of transistor MN2 is connected to the negative supply terminal B at potential Vss. The two transistors MP1, MN2 receive a "Stand-by" control signal on their gates, whereas their drains constitute the inverter output provided to the control input E of bias source 1.

The inverter provides an interface between the rest of the circuit and bias source 1. It additionally inverts the state of the "Stand-by" control signal, which usually is a logic signal whose low state V– represents a request for setting bias source 1 at stand-by. When a request for stand-by is issued, that is, when the "Stand-by" signal passes from its high state to its low state, the signal is inverted by the output of the stand-by device, constituted by CMOS inverter MP1, MN2. Since the inverter output is provided to the drains of the MOS transistors of the first branch of bias source 1, this output will turn off the upper MOS transistor of the branch by bringing its gate to potential Vcc, minus the voltage drop in the series resistance of transistor MP1. At this point, bias source 1 is at stand-by.

The output S of such a bias source 1 is constituted by the drains of the MOS transistors of the second branch. Its purpose is to activate the biasing of circuit units in which bias source 1 is implanted by means of current sources 2 controlled by bias source 1. These current sources are, for example, constituted by n-channel MOS transistors connected as current mirrors with the lower n-channel MOS transistors of bias source 1.

FIGS. 2A–2B show two timing diagrams of the current Iinv which flows through the CMOS inverter in connection with an example of a "Stand-by" signal, as well as the control potential E of bias source 1.

As can be seen, current Iinv attains a peak at the switching of the "Stand-by" signal to a stand-by state. The peak drops following the "Stand-by" signal. Voltage E is effectively inverted to switch off bias source 1, but the current flowing through the inverter causes a consumption which diminishes the autonomy of the devices in which it is implanted. Indeed, if the peak amplitude of current Iinv can be set by selecting the surface of the CMOS transistors constituting the inverter, its duration depends on the "Stand-by" signal. As a matter of fact, it depends on the switching time of the "Stand-by" signal between its two logic states.

Moreover, as can be seen on the figure, the "Stand-by" control signal usually does not switch between the two bias source supply potentials Vcc and Vss, but between two intermediate potentials V+ and V–. In this case, there is a continuous conduction in the inverter during the stand-by state of bias source 1, which causes a significant residual consumption during bias source stand-by periods. It should be noted that the value of potential V+ must be higher than Vcc-Vgsp, where Vgsp is the gate-source threshold voltage of transistor MP1, or else bias source 1 will be continuously at stand-by.

SUMMARY OF THE INVENTION

The invention aims at reducing the power consumption in this type of inverter, and thus at increasing the autonomy of independently supplied systems in which a device for setting a bias source at stand-by is implanted. A first object is to reduce the consumption at inverter switching. A second object is to make the current flowing through the inverter independent of the potentials of the logic states of the stand-by control signal.

To achieve these objects, the present invention provides a device for setting a bias source at stand-by through a stand-by control signal, comprising an inverter with an active load controlled by the bias source.

According to an embodiment of the present invention, said inverter includes a first p-channel MOS transistor, the source of which is connected to a positive terminal of the supply voltage of the bias source, the drain of which constitutes the inverter output connected to a control input of the bias source, and the gate of which constitutes the inverter input receiving the stand-by control signal.

According to an embodiment of the present invention, the drain of the first transistor is connected to a current source, constituting the bias source controlled active load.

According to an embodiment of the present invention, the current source includes a second n-channel MOS transistor, the source of which is connected to a negative supply terminal of the bias source and the drain of which is connected to the drain of the first transistor of the inverter, the gate of the second transistor being connected to the output of the bias source.

According to an embodiment of the present invention, said second transistor of the inverter is connected as a current mirror with a transistor of the bias source.

According to an embodiment of the present invention, the stand-by control signal is a logic signal having states whose potentials are different from the actual potentials on the bias source supply terminals, each state of the stand-by control signal being associated with a state, active or inactive, of the bias source.

According to an embodiment of the present invention, the device further includes means for reactivating the bias source as the stand-by control signal switches to its state associated with the active bias source state.

According to an embodiment of the present invention, said reactivating means include an external source producing an active load control signal, triggered by the stand-by control signal, said active load control signal being active during the switching of the stand-by control signal from its state associated with the inactive bias source state to its state associated with the active bias source state.

According to an embodiment of the present invention, the device is applied to a ΔVbe/R bias source.

The use of an active load in the inverter of the stand-by control signal, and having the bias source itself control the load, allows the current flowing through the inverter to be cancelled as soon as the bias source is deactivated.

Thus, the width of the current peak at the switching of the inverter is considerably reduced, which limits the power consumption in the inverter during the switching phase.

Moreover, the current flowing through the inverter is made independent of the value of the potentials of the states of the stand-by control signal. The value of the current is now set by the current source constituting the active load. Thus, the power consumption of the inverter is essentially reduced in the case where the potentials of the states of the stand-by control signal are different from the potentials at the bias source supply terminals.

The foregoing and other objects, features and advantages of the present invention will be discussed in detail in the following description of specific embodiments, taken in conjunction with the accompanying drawings but not limited by them.

DETAILED DESCRIPTION

Figure 1:
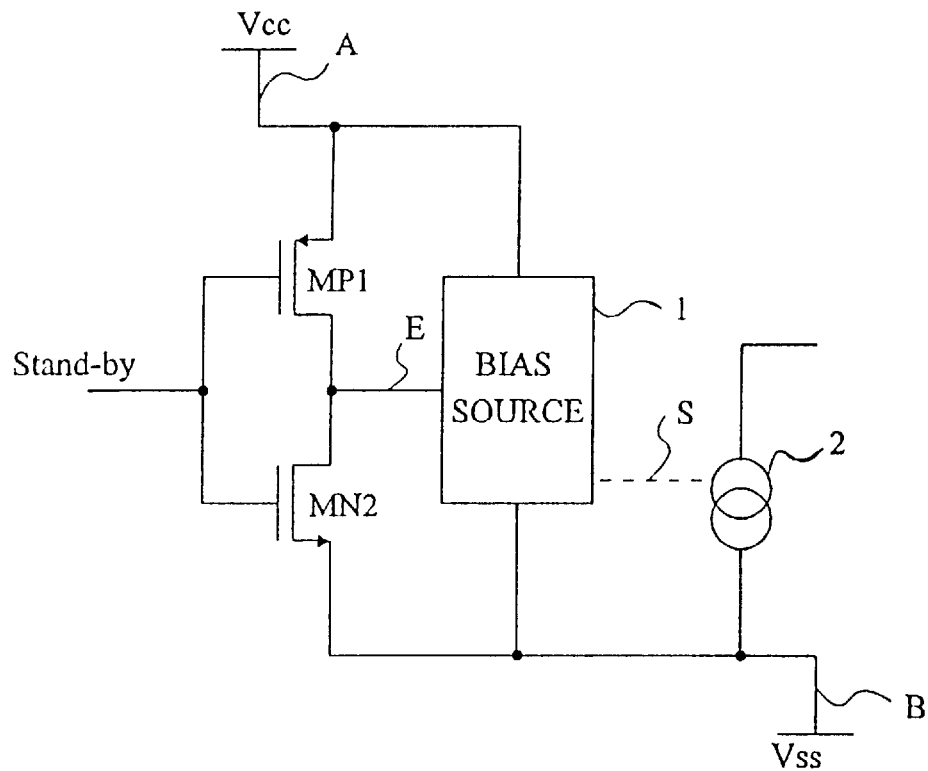
FIGS. 1, 2A and 2B, as described above, illustrate the state of the art and the problem to be solved.
Figure 3:
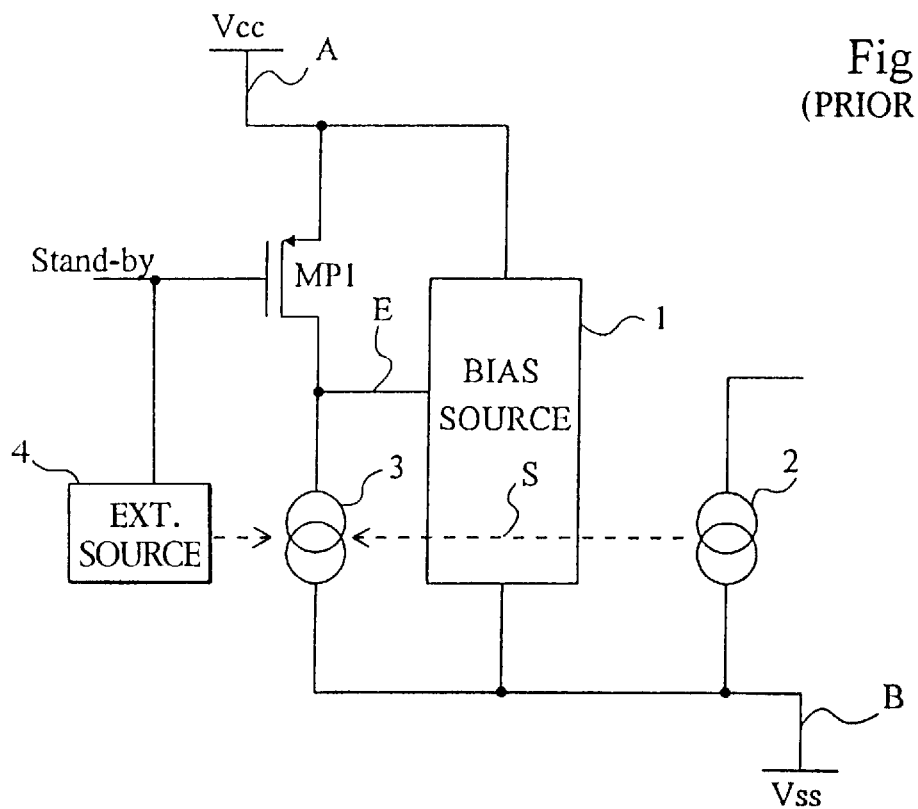
FIG. 3 schematically shows an embodiment of a stand-by device according to the present invention.
Figure 2A:
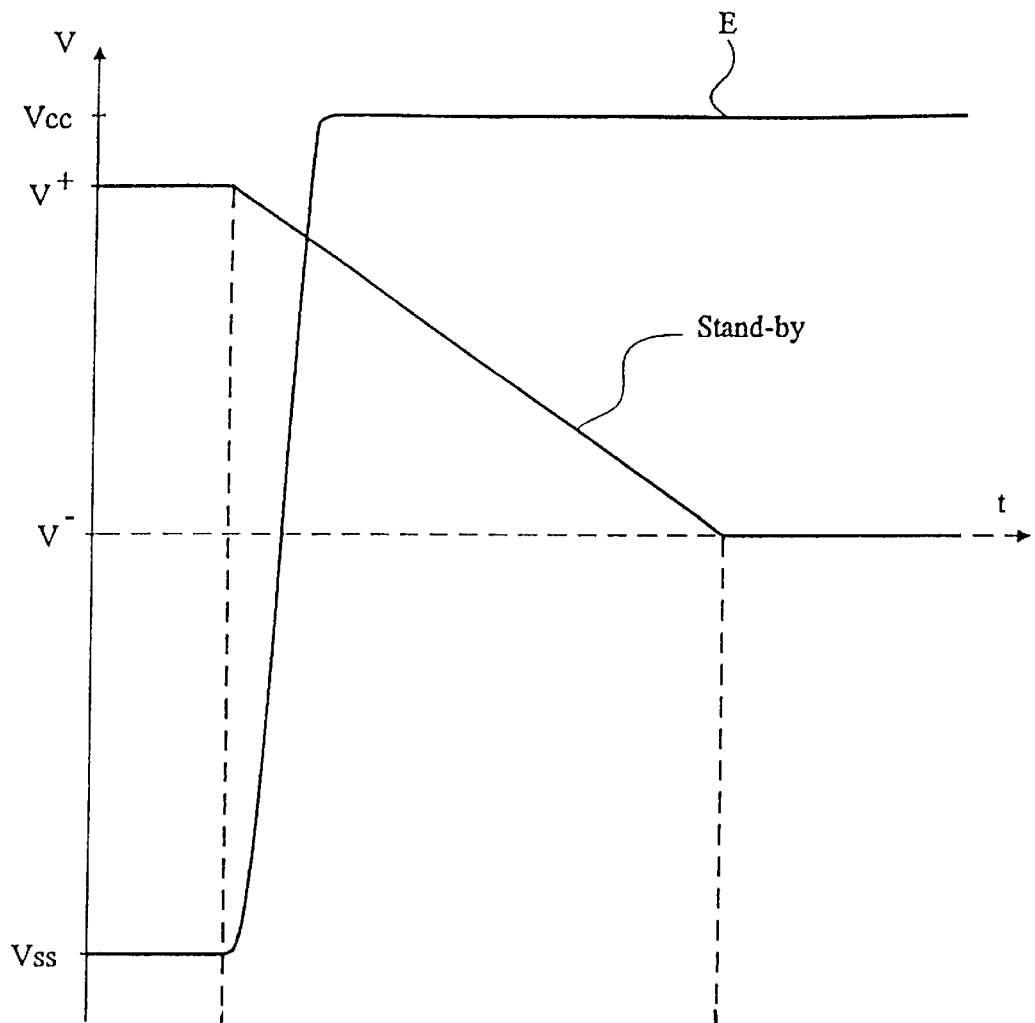
Figure 2B:
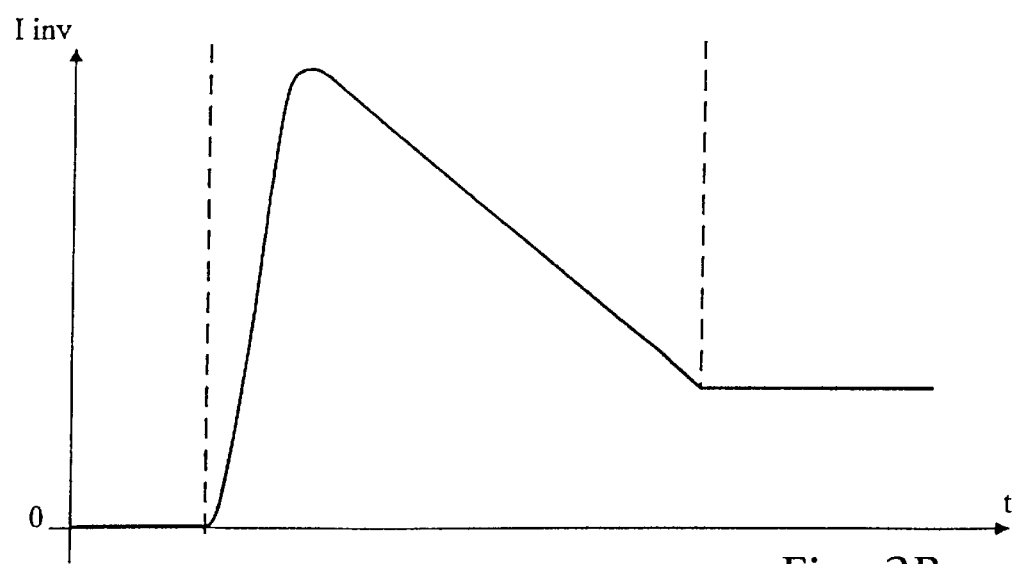

The stand-by device according to the invention, shown for example in FIG. 3, is an inverter with an active load. It is constituted by a MOS transistor MP1, the source of which is connected to a positive terminal A at a supply voltage potential Vcc of a bias source 1. The drain of transistor MP1 is connected to a positive terminal of a current source 3, the negative terminal of which is connected to a negative terminal Vss of the supply voltage of bias source 1. A "Stand-by" control signal is transmitted to the gate of transistor MP1, whereas the inverter output is drawn from its drain. This output is transmitted to a control input E of bias source 1. Current source 3, which is the active load of the inverter, is controlled by output S of bias source 1. The control is carried out by reproducing the current flowing through one of the branches of bias source 1. That is, current source 3 is connected as a current mirror on a current source of bias source 1.

Output S of bias source 1, which is conventionally used to activate current sources 2 of the units to be biased, is thus used to control active load 3 of the inverter.

In the case where bias source 1 is a ΔVbe/R source, active load 3 is constituted by an n-channel MOS transistor connected as a current mirror with the lower n-channel MOS transistors of bias source 1. The drain of this transistor is connected to the drain of transistor MP1, whereas its source is connected to supply voltage terminal B, the gate of this n-channel transistor being connected to the output terminal S of bias source 1. Thus, current source 3 is effectively controlled by the current that flows through bias source 1. Still in the case of a ΔVbe/R bias source 1, its control input E is constituted by the drains of the two MOS transistors of its first branch.

Figure 4A:
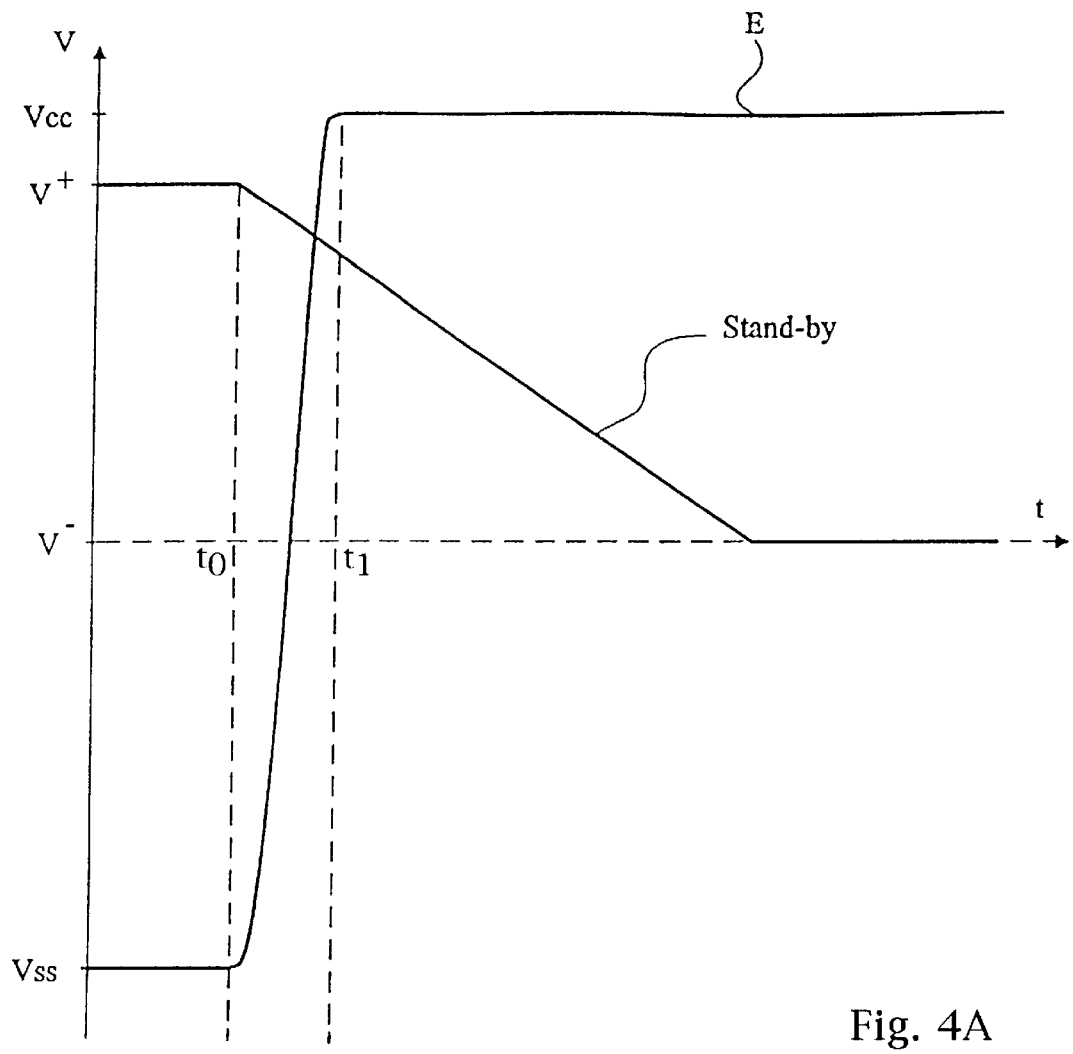
FIGS. 4A and 4B shows two timing diagrams representing the waveforms of the most significant voltages and currents of the stand-by device shown in FIG. 3.
Figure 4B:
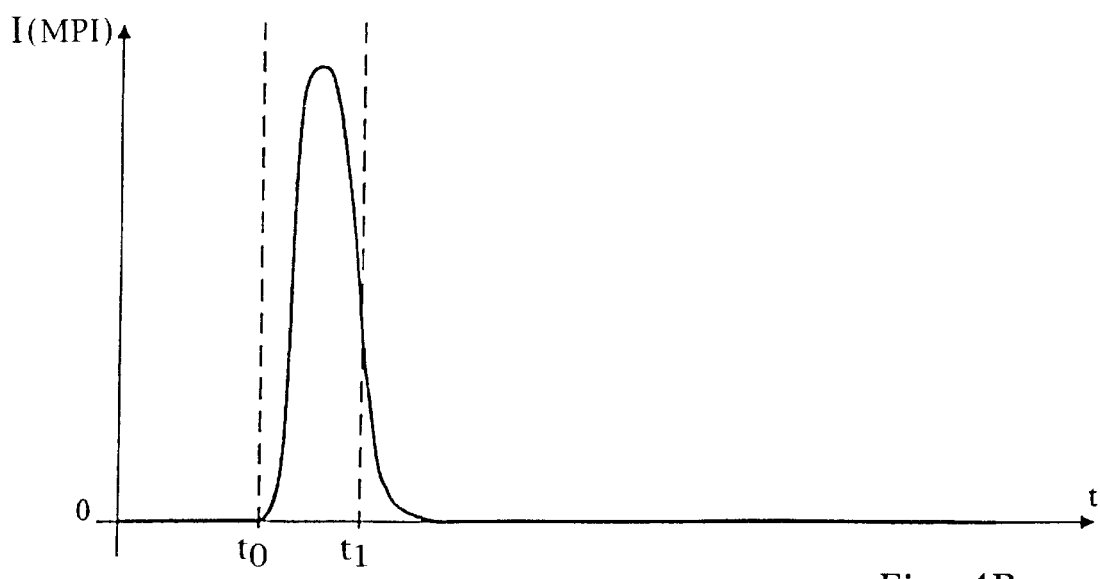

The operation of the stand-by device is illustrated by FIGS. 4A and 4B. FIGS. 4A and 4B shows two timing diagrams representing current I(MP1) flowing through transistor MP1 in relation with the "Stand-by" signal and the potential of control input E of bias source 1 which corresponds to the drain potential of transistor MP1.

The "Stand-by" signal has two states between two potentials V+ and V−. When stand-by is not activated, that is, as long as the "Stand-by" signal is at potential V+, no current flows through transistor MP1. As soon as the "Stand-by" signal, in transiting towards its low state V−, goes under potential Vcc-Vgsp (time t0), transistor MP1 turns on. This causes a peak of current I(MP1), the amplitude of which depends on current source 3. As soon as the voltage drop at the inverter output is high enough to deactivate bias source 1 (time t1), the signal transmitted by the latter to current source 3 disappears. Indeed, since no current flows any longer through bias source 1, no current can be reproduced on current source 3. Therefore, the value of current I(MP1) through transistor MP1 drops. The width of the peak of current I(MP1) is thus made independent of the width of the transition of the "Stand-by" signal. Moreover, even if the signal varies, as is shown, between two potentials V+, V− different from the supply voltage of bias source 1, no current flows through the inverter.

When the "Stand-by" control signal returns to its high state, corresponding to an active state request for bias source 1, bias source 1 must be restarted.

In order to do this, conduction must be forced in current source 3, so as to enable the potential of control input E of bias source 1 to be brought to a value allowing the p-channel MOS transistors of bias source 1 to be turned on again. This biasing of the upper MOS transistors of bias source 1 is carried out by the inverter when the "Stand-by" signal exceeds potential Vcc-Vgsp in transiting towards its high state, but provided that a current may flow through the inverter.

A plurality of solutions may be used to allow the restart.

For example, as shown in FIG. 3, an "Ext" control signal from an external source 4 may be applied to the control input of current source 3. The "Ext" signal may be a square wave with sufficient amplitude to restart the conduction of active load 3. The square is, for example, initialised by the rising edge of the "Stand-by" signal and ended by the falling edge of the signal present on control input E of bias source 1. Outside these intervals, no external signal is applied to current source 3 which is the active load, so that it is then only controlled by bias source 1. The "Ext" control signal has only the role of forcing the conduction in active load 3, and thus allowing conduction in the inverter when the "Stand-by" control signal returns to its high state V+.

Alternatively, a dc voltage having a low value independent of the "Stand-by" signal could, for example, be applied to the control input of current source 3. This would result in a continuous conduction of active load 3 of the inverter, yet with a current value independent of the "Stand-by" signal. This maintaining current can be chosen to be a very low value.

As just seen above, the invention allows a reduction of power consumption in a stand-by device, without harming the operating principle of setting the bias source at stand-by. This reduction of the consumption is all the more important as the difference between low state V− of the "Stand-by" control signal and potential Vss of negative terminal B of bias source 1 is important. The width of the peak of the current flowing through the inverter now only depends on the switching time of the transistors constituting bias source 1.

Besides, the invention allows, as a secondary effect, to control stand-by by using a "Stand-by" signal in the form of pulses. Indeed, in the known circuits, the stand-by control signal must be continuous, otherwise the bias source is reactivated. Now, a pulse of the stand-by signal is enough to deactivate bias source 1. In fact, as long as a signal forcing conduction in active load 3 is not applied, bias source 1 remains deactivated, whatever the level of the stand-by control signal may be.

Of course, various alternative embodiments and modifications of the invention will appear to those skilled in the art. Particularly, in the above description, the respective high and low state of the stand-by control signal was assumed to respectively correspond to the active and inactive state of the bias source. The inverse can be easily implemented, for example, by inverting the stand-by control signal. Additionally, each of the described components constituting the inverter can be replaced by one or several elements assuming the same function. Additionally, the bias source described by way of example as a ΔVbe/R source can be a source of any type.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A device having a control input and an output for setting a bias source having a control input and an output at stand-by through a standby control signal comprising:

a p-channel MOS transistor whose source is connected to a positive supply voltage terminal of the bias source, whose drain constitutes an inverter output connected to the control input of the bias source, and whose gate constitutes an inverter input receiving the stand-by control signal; and a current source connected to the drain of the p-channel MOS transistor, the current source comprising an n-channel MOS transistor whose source is directly connected to a negative supply voltage terminal of the bias source, and whose drain is directly connected to the drain of the p-channel MOS transistor, the gate of the n-channel MOS transistor being connected to the output of the bias source.

2. The device of claim 1, wherein the n-channel MOS transistor is connected as a current mirror with a transistor of the bias source.

3. The device of claim 1, wherein the stand-by control signal is a logic signal having states whose potentials differ from the potentials present at the supply terminals of the bias source, each state of the stand-by control signal corresponding to a state, active or inactive, of the bias source.

4. A device having a control input and an output for setting a bias source at stand-by through a standby control signal comprising:

a p-channel MOS transistor whose source is connected to a positive supply voltage terminal of the bias source, whose drain constitutes an inverter output connected to the control input of the bias source, and whose gate constitutes an inverter input receiving the stand-by control signal; and a current source connected to the drain of p-channel MOS transistor, the current source comprising an n-channel MOS transistor whose source is connected to a negative supply voltage terminal of the bias source, and whose drain is connected to the drain of the p-channel MOS transistor, the gate of the n-channel MOS transistor being connected to the output of the bias source; wherein the stand-by control signal is a logic signal having states whose potentials differ from the potentials present at the supply terminals of the bias source, each state of the stand-by control signal corresponding to a state, active or inactive, of the bias source; and the device further comprising means to reactivate the bias source at the switching of the stand-by control signal to its state corresponding to the active state of the bias source.

5. The device of claim 4, wherein said reactivating means comprise an external source producing a control signal for the active load, triggered by the stand-by control signal, said control signal for the active load being active during the switching of the stand-by control signal from its state associated with the inactive state of the bias source to its state associated with the active state of the bias source.

6. A device for setting a bias source at stand-by in response to a stand-by control signal comprising a transistor having a current flowing therethrough which is substantially independent of a level of the stand-by control signal, the current flowing through the transistor provided by an active load having an output directly connected to the transistor the active load controlled by the bias source.

7. The device of claim 6, wherein the current flowing through the transistor is controlled by the bias source.

8. The device of claim 7, wherein the current flowing through the transistor is provided by an active load.

* * * * *